July 4, 1972 W. O. DRUSCHEL 3,674,487
MASK OVERLAY CHECKING MEANS
Filed June 18, 1970 2 Sheets-Sheet 1
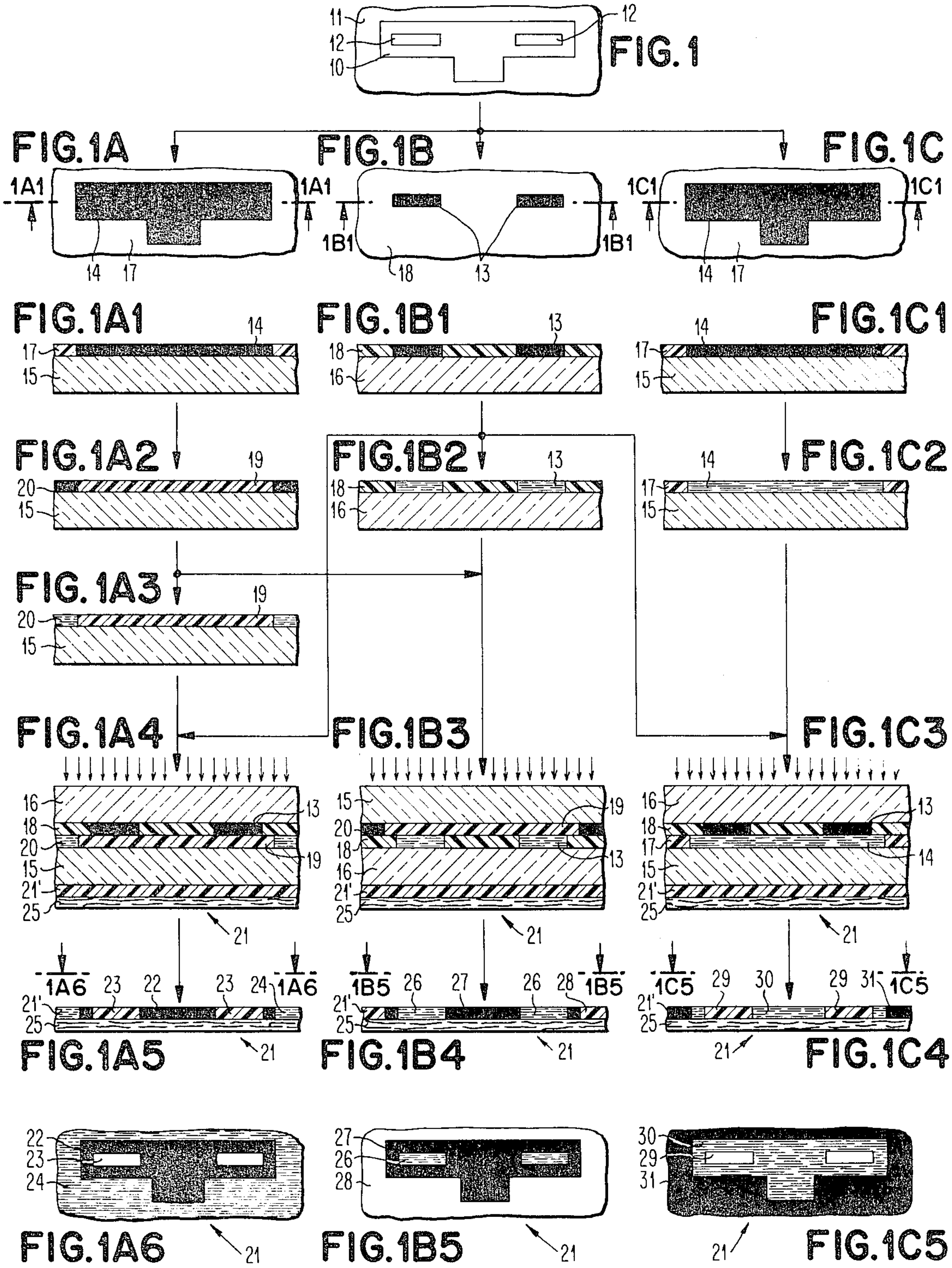
FIG. 1, FIG. 1A, FIG. 1B, FIG. 1C, FIG. 1A1, FIG. 1B1, FIG. 1C1, FIG. 1A2, FIG. 1B2, FIG. 1C2, FIG. 1A3, FIG. 1A4, FIG. 1B3, FIG. 1C3, FIG. 1A5, FIG. 1B4, FIG. 1C4, FIG. 1A6, FIG. 1B5, FIG. 1C5
INVENTOR
WILLIAM O. DRUSCHEL
BY J. B. Kraft
ATTORNEY

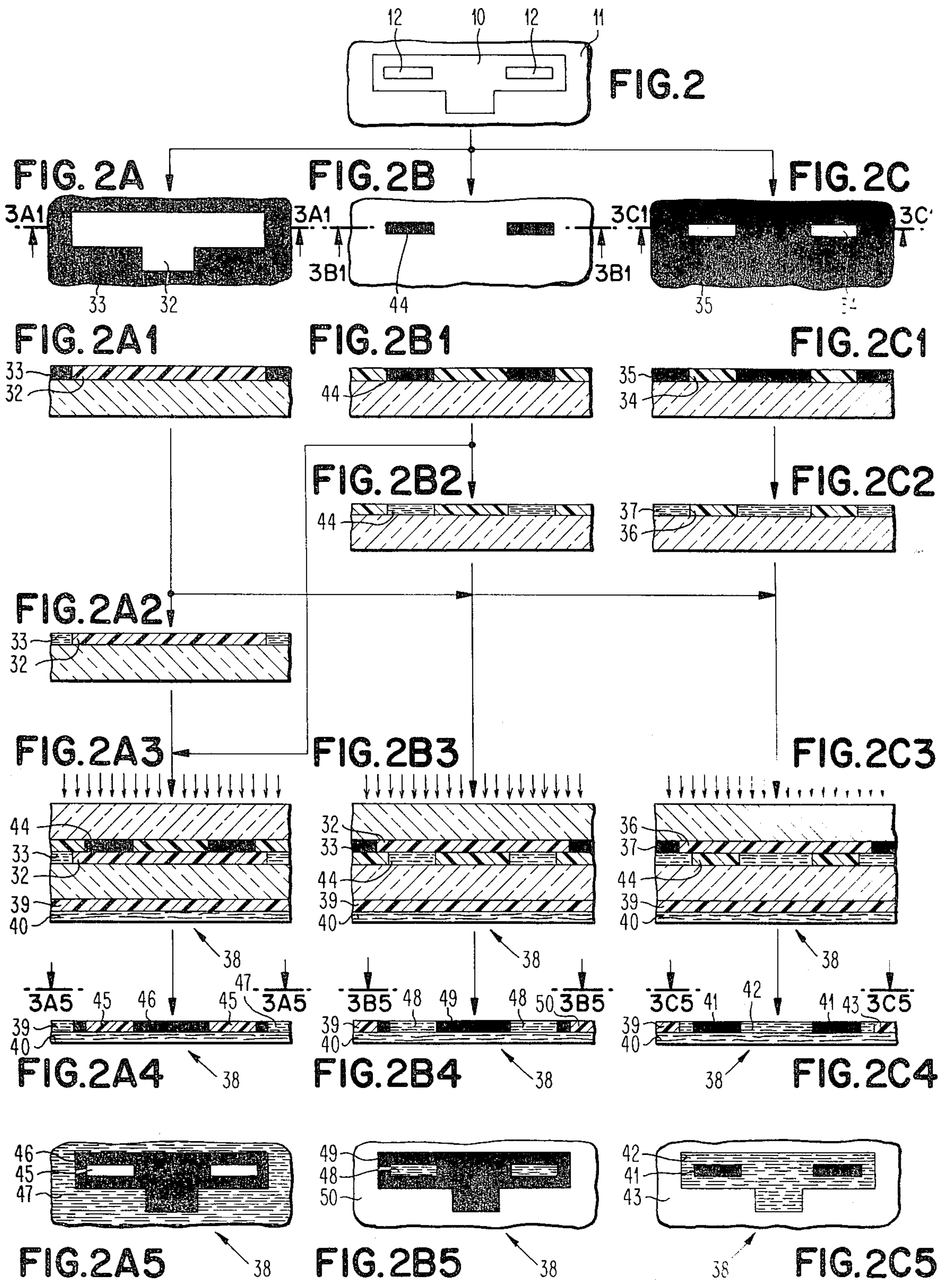
FIG. 2, FIG. 2A, FIG. 2B, FIG. 2C, FIG. 2A1, FIG. 2B1, FIG. 2C1, FIG. 2B2, FIG. 2C2, FIG. 2A2, FIG. 2A3, FIG. 2B3, FIG. 2C3, FIG. 2A4, FIG. 2B4, FIG. 2C4, FIG. 2A5, FIG. 2B5, FIG. 2C5

United States Patent Office 3,674,487

Patented July 4, 1972

3,674,487

MASK OVERLAY CHECKING MEANS

William O. Druschel, Granite Springs, N.Y., assignor to International Business Machines Corporation, Armonk, N.Y.

Filed June 18, 1970, Ser. No. 47,497
Int. Cl. G03c 5/04, 5/06
U.S. Cl. 96—41 24 Claims

ABSTRACT OF THE DISCLOSURE

A method for comparing the pattern in a pair of light masks, e.g., masks having regions transparent to light and regions opaque to light. A light masking copy, either positive or negative, of each of the masks is made. The opaque region in one of said copies is rendered semitransparent, after which a light sensitive substrate is exposed through both of said copies superimposed in registration with each other to produce a three-tone composite image in the light sensitive substrate of the pair of masks in registration.

Where one of the masks has smaller regions which should be positioned within limits of larger regions on the other mask when said masks are used in registration with each other, the type of copy, either positive or negative, made of each mask as well as the selection of the mask in which the opaque regions are rendered semitransparent is governed by the requirement that said smaller regions in said copies are at least as opaque as said larger regions.

BACKGROUND OF INVENTION

(1) Field of the invention

The present invention relates to mask comparison and more particularly to overlay mask comparison in order to determine the relationship of geometric patterns in a pair of masks when said masks are used in registration with each other.

(2) Description of the prior art

In the fabrication of semiconductor devices and integrated circuits, the processing steps involve the exposure to light of the semiconductor substrate coated with light sensitive photo-resist sequentially through a series of masks. These masks are usually formed on glass or plastic substrates or in metallic sheets of film with openings therein. Such masks allow the passage of light through accurately defined windows or transparent regions. The particular geometry of each mask or pattern of opaque and transparent regions will determine the photo-resist pattern adhering to the substrate during each particular processing step and consequently will determine the pattern of the impurity diffusion, metallurgy applied or insulative material applied during a particular processing step. Since the relationship of the positions of the various diffused regions, metallurgy pattern, and insulative material pattern is critical to the fabrication of the device or integrated circuit, it is necessary to have a mask comparison method by which the relationship of the patterns in a pair of masks used in the processing sequence may be determined. This comparison is known as mask overlay checking.

The standard practice of mask overlay checking involves the coloring of enlarged plastic copies of the mask in a series of colors, each representative of a particular mask used in the sequence. This means of mask overlay checking by means of color keys is both expensive and time consuming. If the masks are prepared in the conventional manner in which the artwork of the mask is generated manually on a scale in the order of 200× and plastic overlays prepared from this artwork on the same scale, the colored keyed overlay copies may be prepared at this 200× level prior to the reduction of the actual mask size. However, where the mask is generated automatically, e.g., by a program light table as described in Automatic Artwork Generation for Large Scale Integration, Cook et al., IEE Journal of Solid State Circuits, vol. SC–2, No. 4, December 1967, the mask artwork produced is only at the 10× level with respect to the mask size. With the geometries at this 10× level, the standard color key overlay checking scheme cannot be efficientlty used. In order to use color key overlay checking, it will probably be necessary for the 10× level pattern to be enlarged to a level in the order of 100–200×. The additional expense and time required for such enlargements, which would have no other function except for checking, renders this approach impractical.

SUMMARY OF THE INVENTION

Accordingly, it is a primary object of the present invention to provide a practical and efficient method of comparing the respective geometries of a pair of mask overlays or masks used sequentially in a fabrication operation.

It is a further object of the present invention to provide a method for determining the positional relationships of pattern regions in a first mask to pattern regions in the second mask, when said first and second mask are in registration.

It is another object of the present invention to provide a method for permanently recording the positional relationship of regions in a pair of overlay masks.

It is an even further object of the present invention to provide a method for overlay mask comparison which produces a composite image of a pair of masks to be compared in which respective regions in each of the masks are easily discernible.

The present invention provides a method of mask overlay checking of a pair of masks each of which have pattern regions substantially transparent to light and other pattern regions substantially opaque to light which eliminates the need for conventional color overlays used in such mask comparisons. In the method of the present invention, the actual masks may be used. However, since the comparison method alters the characteristics of at least one of the masks, a light masking copy of said one mask and preferably of both masks are used in the present comparison method. These copies may be direct copies or enlarged copies of the mask. In the following discussion of the present invention, the terms "mask" and "mask copy" will be used. The term "mask" is meant to be broad enough to include the actual mask and copies thereof, while the term "mask copy" is meant to be broad enough to include both positive type and negative type copies of the mask.

In accordance with present invention in general, a light sensitive substrate which may conveniently be a silver halide photographic emulsion coating on a paper backing is exposed to a light source through each of the pair of masks to be compared. Each of the masks is in a position in registration with that of the other during its respective exposure; the exposures may be simultaneous or sequential.

However, the manner of exposure should be such that the light sensitive substrate region corresponding to one of the two regions, i.e. either the opaque or transparent regions, in one of the masks is only partially exposed.

The region in the substrate to be partially exposed may correspond to an opaque region in said one mask, as shown in FIG. 1C or the region to be partially exposed may correspond to a transparent region, as shown in FIG. 1A. These regions may conveniently be rendered semitransparent in the manner to be described hereinafter with respect to FIG. 1 prior to the exposure of the substrate through said one mask. The exposure of the light sensitive substrate through said masks results in a composite three-tone image in the developed light sensitive substrate of the two masks in registration; the three tones are a gray tone corresponding to the above described partially exposed region, a white tone corresponding to the opaque regions in the overlay mask and a black tone corresponding to the transparent region through said overlayed masks.

In accordance with a more specific aspect of the present invention, where smaller regions in one of the masks are to be positioned within limits of larger regions in the other mask when said masks are in registration, the type of copy made, i.e. either a positive or a negative copy, of each mask as well as which of the masks will have its opaque regions semitransparentized should be determined by the requirement that said smaller regions are at least as opaque as said larger regions.

The foregoing and other objects, features and advantages of the invention will be apparent from the following more particular description and preferred embodiments of the invention as illustrated in the accompanying drawings.

BRIEF DESCRIPTION OF THE DRAWINGS

FIG. 1 is a flow diagram primarily in cross-section, showing the steps of three alternate embodiments of the method of the present invention.

FIG. 2 is a photograph of a portion of a three-tone composite image of a pair of masks in registration produced by the method of the present invention.

FIG. 3 is a flow diagram primarily in cross-section of three alternative techniques for carrying out a further embodiment of the method of the present invention.

DESCRIPTION OF THE PREFERRED EMBODIMENTS

With reference to FIGS. 1, 1A, 1B and 1C, in the formation of integrated circuits, a metal connector pattern is formed over the surface of the semiconductor substrate, a layer of silicon dioxide is applied over the metal pattern and contact holes are formed through the silicon dioxide layer to the metal pattern at selected points. The metal pattern and contact holes are formed by conventional photo-resist/etching techniques. The photo-resists used to protect selected regions of the metal or silicon dioxide during the formation patterns or openings therein by etching, are respectively formed by exposure through masks. FIG. 1 diagrammatically shows such a metal pattern and contact hole arrangement. Metal region 10 is formed by selective etching of a metal layer on substrate 11. A pair of contact holes 12 are formed by etching through a subsequently applied silicon dioxide layer and must be positioned within the limits of region 10 in order to avoid improper contact and/or short circuiting. Consequently, it is important to compare the mask used in the metal formation shown in FIG. 1A with the mask used in the contact hole formation shown in FIG. 1B, in order to ascertain that when these two masks are used in registration with each other, the smaller region 13 in the contact hole mask will fall completely within the limits of the larger region 14 in the metallization mask. FIGS. 1A(1) and 1B(1) respectively show the metallization and the contact hole mask in cross-section. In these masks, the metallization region 14 and the contact hole region 13 are respectively opaque while the remainder of each mask is transparent. The masks in FIG. 1A(1) and 1B(1) are conventional masks used in semiconductor processing. Each contain a glass substrate respectively designated as 15 and 16 on which coatings 17 and 18 are applied. These coatings may conventionally be developed silver halide photographic emulsion coatings conventionally used in masks.

In order to conduct a comparison process of the present invention, a negative copy of the metallization mask is made and is shown in FIG. 1A(2). This negative copy may conveniently be another photographic emulsion mask on a glass substrate, which is made by any standard means such as contact exposure through the original metallization mask of FIG. 1A(1). In this negative copy, the metallization region 19 is now transparent and the remainder of the mask 20 is opaque. Next, the metallization mask is chemically treated so that opaque regions 20 are rendered semitransparent as shown in FIG. 1A(3). By semitransparent, it is meant that region 20 will now transmit some light but will not be as transparent as region 19. Preferably semitransparent region 20 has a light transmission about halfway between that of an opaque region and that of a substantially transparent region such as region 19. Region 20 may be rendered semitransparent by any convenient method such as bleaching. For example, the mask copy of FIG. 1A(2) may be treated with a dilute aqueous solution of an oxidizing agent such as potassium ferricyanide, preferably in the presence of a halide salt such as sodium bromide to bleach opaque region 20 to a yellow semitransparent region as shown in FIG. 1A(3). Any conventional bleaching approach known in the art may be used to make region 20 semitransparent.

Next, as shown in FIG. 1A(4), the semitransparent copy of the metallization mask of FIG. 1A(3) is superimposed emulsion-to-emulsion on the contact hole mask of FIG. 1B(1); the two masks are in registration, i.e. they are in the positions with respect to one another in which they are to be used in their respective metallization formation and contact hole formation fabrication steps. Instead of using the contact hole mask of FIG. 1B (1) directly, in which case the emulsion coating may be damaged, the contact hole mask used in FIG. 1A(4) may be a direct positive duplicate or copy of the mask in FIG. 1B(1). The superimposed masks are placed in contact with a photosensitive member 21 which is preferably a conventional light sensitive silver halide emulsion photographic coating 22 on a plastic or paper backing 25 and light sensitive member 21 is exposed to a light source not shown through the two superimposed masks. Alternatively, the exposure through the masks may be projected onto a photosensitive member spaced from the masks. The exposed light sensitive member 21 is developed and fixed to produce the image shown in FIG. 1A(5), a plan view of which is shown in FIG. 1A(6). The resulting image 21 contains black region 22 corresponding to the metallization region 10 of FIG. 1, white regions 23 corresponding to contact hole regions 12 of FIG. 1, and gray region 24 corresponding to surrounding region 11 of the substrate in FIG. 1. The image shown in FIG. 1A(6) represents only a portion of a mask overlay comparison image.

The mask overlay checking procedure for determining the relationship of a mask used in the fabrication of contact hole regions and the metallization regions of FIG. 1 may be carried out by alternative techniques. For example, instead of making region 20 of the metallization mask of FIG. 1A(2) semitransparent, region 13 of the contact hole mask of FIG. 1B(1) may be rendered semitransparent as shown in FIG. 1B(2). In this case, the contact hole mask of FIG. 1B(1) cannot be used directly, but rather a positive copy thereof may be so used and this positive copy rendered semitransparent. Then, the mask of FIG. 1B(2) may be superimposed, as previously described, emulsion-to-emulsion against the mask of FIG. 1A(2) in the manner shown in FIG. 1B(3). Light sensitive member 21, previously described, is exposed to light through the superimposed masks by contact or projection exposure then developed and fixed to provide the composite image of FIG. 1B(4), a plan view of which is shown in 1B(5). In this three-tone image, regions corresponding to the contact hole regions, are gray regions 26; black region 27 corresponds to the metallization region and white region 28 corresponds to the surrounding region of the substrate.

By a third approach as shown in FIG. 1C, a positive copy of the metallization mask is made and the opaque region 14 of this mask which corresponds to the metallization regions are rendered semitransparent as shown in FIG. 1C(2).

Then, as shown in FIG. 1C(3), the mask of FIG. 1C (2) is superimposed in the above described manner emulsion-to-emulsion upon the maks of FIG. 1B(1) and light sensitive member 21 is exposed to light through the superimposed masks by contact or projection exposure to produce an image in light sensitive member 21 shown in FIG. 1C(4), a plan view of which is shown in FIG. 1C(5). In the resulting composite image, the regions corresponding to the contact hole regions are white regions 29; gray region 30 corresponds to the metallization region, and black region 31 corresponds to the surrounding substrate.

From the three alternative techniques given in FIG. 1A, 1B and 1C, it will be obvious to those skilled in the art that other combinations may be made in comparing the metallization mask and the contact hole mask in accordance with the method of the present invention. However, in practicing the present method, where smaller regions such as the contact hole regions are to be enclosed within the limits of larger regions, such as metallization region 14, it is important in the superimposed masks that the smaller regions are at least as opaque and preferably more opaque than the larger region. Towards this end, the copies made of each of the masks must be such and the regions rendered semitransparent must be such that the smaller regions in the superimposed masks which in this case would be the regions corresponding to the contact hole regions must be at least as opaque and preferably more opaque than the larger region.

With reference to FIGS. 3, 3A, 3B and 3C, there will now be described alternative embodiments of the present invention the regions to be compared on one or both of the masks are transparent instead of opaque. For convenience in illustration, we will again deal with the case of comparing a pair of masks to be used in the fabrication of metallization region 10 and contact hole region 12 in substrate 11, as shown in FIG. 3. Let us first deal with the situation where in the mask to be used for the metallization, the metallization regions 32 are transparent on an opaque background 33 as shown in FIG. 3A, while in the mask used for the contact hole formation, the regions corresponding to the contact holes 34 are transparent on an opaque background 35 as shown in FIG. 3C. Cross-sections of the mask of FIGS. 3A and 3C are respectively shown in FIGS. 3A(1) and 3C(1). In accordance with the previously described procedure, a positive copy of the contact hole mask shown in 3C(1) is made and the opaque region therein rendered semitransparent to produce the mask shown in FIG. 3C(2) wherein regions 36 corresponding to the contact hole regions are transparent while regions 37 corresponding to the background regions are semitransparent. The mask of 3C(2) is then superimposed upon a positive copy of the metallization mask of FIG. 3A(1), emulsion-to-emulsion, in the manner previously described, and a light sensitive member 38 comprising a plastic opaque substrate 39 and a light sensitive coating 40 is exposed to light through the superimposed masks by projection or contact exposure as shown in FIG. 3C(3) to produce the composite image of 3C(4), a plan view of which is shown in FIG. 3C(5). In this composite, black regions 41 corresponds to the contact holes, gray region 42 corresponds to the metallization region and white region 43 corresponds to the background region of the substrate.

In an alternate comparison procedure wherein the mask of FIG. 3A, having transparent area 32 corresponding to the metallization region is to be compared to the mask of FIG. 3B, in which opaque areas 44 correspond to the contact hole regions, a positive copy of the metallization mask is made and the opaque areas in this positive copy are transparentized to produce the mask shown in FIG. 3A(2). The mask of FIG. 3A(2) is then superimposed upon a positive copy of the contact hole mask shown in FIG. 3B(1) to provide the superimposed structure shown in FIG. 3A(3). Light sensitive member 38 is then exposed to a light source through the superimposed masks by projection or contact exposure and member 38 is developed and fixed to produce the composite three-tone image shown in FIG. 3A(4), a plan view of which is shown in FIG. 3A(5). In this composite image, white regions 45 correspond to the contact holes, black region 46 corresponds to the metallization region, and gray region 47 corresponds to the background region in the substrate.

Alternatively, when the contact hole mask of FIG. 3B is to be compared to the metallization mask of FIG. 3A, a positive copy of the contact hole mask may be treated in the previously described manner to render its opaque region semitransparent as shown in FIG. 3B(2). The mask of 3B(2) is then superimposed upon a positive copy of the base mask shown in FIG. 3A(1) to produce the superimopsed structure shown in FIG. 3B(3). Light sensitive substrate 38 is then exposed to a source of light through the superimposed masks by contact or projection exposure and this light sensitive member is developed and fixed to produce the composite image shown in FIG. 3B(4), a plan view of which is shown in FIG. 3B(5). In this composite image, gray regions 48 corresponds to the contact holes, black region 49 corresponds to metallization region and white region 50 corresponds to the background region of the substrate.

Some additional advantages of the method of the present invention over the prior art colored mask overlay method is that by the present method much greater areas of the masks may be compared. Because of the greater magnification required in the color overlays, the mask areas which can be compared, correspond only to small portions of an integrated circuit chip while by the present method, the mask area compared correspond to the whole chip. This permits a more accurate determination of the positional relationship in the mask area corresponding to the whole chip.

The present method also permits the selection of any magnification necessary to bring out the details in the comparison as the superimposed masks being compared may be projected onto the photosensitive member in any desired magnification.

Also, since the results of the comparison are in black, white and gray tone, they may be transmitted over telecommunications systems; such transmission is not possible with color overlays.

While the illustrative example showed a comparison of the masks used for the metallization and contact masks, it will be obvious that the method of the present invention may be used in the comparison of any of the sequential masks used in semiconductor device fabrication, e.g., a comparison of the masks used for the emitter and base diffusions, in which case the emitter regions formed by one mask must be positioned within the limits of the base regions. In addition, utilization of the methods of the present invention for light mask comparison outside of the semiconductor field will be evident to those skilled in the art. For example, in the printing and graphic arts, comparison of sequential photographic masks may be at times necessary. In lenticular printing, for example, such comparison may be advantageous.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for comparing the patterns in a pair of masks, each mask having regions transparent to light and regions opaque to light comprising:
   exposing a light sensitive substrate through said first mask in such a manner that the substrate regions corresponding to one of the two regions in said first mask are partially exposed, and
   exposing said light sensitive substrate through said second mask to fully expose the substrate regions coincident with the transparent regions in the second mask, said second mask being in a position in registration with that of the first mask
   to thereby produce a three-ton composite image of the two masks in registration.

2. The method of claim 1 wherein the substrate regions coincident with the opaque regions in the first mask are partially exposed by rendering said opaque regions semitransparent prior to the exposure through said first mask.

3. The method of claim 1 wherein said exposures through the first and second masks are performed simultaneously.

4. The method of claim 2 wherein said exposures through the first and second masks are performed simultaneously.

5. The method of claim 1 wherein at least one of the masks used in the exposures is a copy of one of a pair of masks being compared.

6. A method for comparing the patterns in a pair of masks, each mask having regions transparent to light and regions opaque to light comprising:
   forming a light masking copy of at least one of said pair of masks,
   rendering semitransparent the opaque regions in one of said at least one copies, and
   exposing a light sensitive substrate through said semitransparent masking copy and through said other mask, said masking copy and said mask being in positional registration with each other to produce a three-tone composite image in said substrate of the pair of masks in registration.

7. The method of claim 6 wherein light masking copies of both masks are formed and the opaque regions in one of the masking copies are transparentized.

8. The method of claim 6 wherein one of said at least one copy is a positive copy.

9. The method of claim 6 wherein one of said at least one copy is a negative copy.

10. A method for determining the positional relationship of pattern regions in a first mask to pattern regions in second masks when said masks are in registration, each of said masks having pattern regions substantially transparent to light and pattern regions substantially opaque to light, said first mask having smaller regions which are to be positioned within limits of larger regions in the second mask, comprising:
   forming a light masking copy of one of said masks,
   rendering semitransparent the opaque regions in said copy, and
   exposing a light sensitive substrate through said copy and said other mask, said masking copy and said other mask being in positional registration with each other, to produce a three-tone composite image of said first and second masks in registration,
   the mask of which a copy is made being such and the copy being of such a type that said smaller regions are at least as opaque as said larger regions.

11. The method of claim 10 wherein the larger regions in the second mask are opaque and said light masking copy is a negative type copy of said second mask.

12. A method for determining the positional relationship of pattern regions in a first mask to pattern regions in a second mask when said masks are in registration, each of said masks having pattern regions substantially transparent to light and pattern regions substantially opaque to light, said first mask having smaller regions which are to be positioned within limits of larger regions in the second mask, comprising:
   forming light masking copies of both of said masks,
   rendering semitransparent the opaque regions in one of said copies, said copies being of such type and the mask rendered semitransparent being such that said smaller regions are at least as opaque as said larger regions, and
   exposing a light sensitive substrate through both of said copies maintained in positional registration with each other to produce a three-tone composite image of said first and second masks in registration.

13. The method of claim 12 wherein the larger regions in the second mask are opaque and the copy of the second mask is a negative type copy.

14. The method of claim 13 wherein the opaque regions in the copy of the second mask are rendered semitransparent.

15. The method of claim 13 wherein the smaller regions in the first mask are opaque and the copy of the first mask is a positive type copy.

16. The method of claim 15 wherein the opaque regions in the copy of the first mask are rendered semitransparent.

17. The method of claim 12 wherein the larger regions in the second mask are opaque, the copy of the second mask is a positive type copy and the opaque regions in the copy of the second mask are rendered semitransparent.

18. The method of claim 17 wherein the smaller regions in the first mask are opaque and the copy of the first mask is a positive type copy.

19. The method of claim 17 wherein the smaller regions in the first mask are transparent and the copy of the first mask is a negative type copy.

20. The method of claim 12 wherein the larger regions in the second mask are transparent and the copy of the second mask is a positive type copy.

21. The method of claim 20 wherein the opaque regions in the copy of the second mask is rendered semitransparent.

22. The method of claim 20 wherein the smaller regions in the first mask are transparent and the copy of the first mask is a negative type copy.

23. The method of claim 22 wherein the opaque regions in the copy of the first mask are rendered semitransparent.

24. The method of claim 20 wherein the smaller regions in the first mask are transparent, the copy of the first mask is a positive type copy and the opaque regions in the copy of the first mask are rendered semitransparent.

References Cited

UNITED STATES PATENTS

| | | | |
|---|---|---|---|
| 3,403,024 | 9/1968 | Luce | 96—36 |
| 3,506,442 | 4/1970 | Kerwin | 96—44 |
| 3,411,905 | 11/1968 | Mooney et al. | 96—44 |

NORMAN G. TORCHIN, Primary Examiner

E. C. KIMLIN, Assistant Examiner

U.S. Cl. X.R.

96—44, 38.3